US012811112B2

(12) United States Patent
Hong

(10) Patent No.: US 12,811,112 B2
(45) Date of Patent: Nov. 24, 2026

(54) APPARATUS AND METHOD FOR CONTROLLING TEMPERATURE OF CHAMBER

(71) Applicant: SEMES CO., LTD., Cheonan-si (KR)

(72) Inventor: Hakgyun Hong, Seoul (KR)

(73) Assignee: SEMES CO., LTD., Cheonan-si (KR)

( * ) Notice: Subject to any disclaimer, the term of this patent is extended or adjusted under 35 U.S.C. 154(b) by 216 days.

(21) Appl. No.: 18/396,470

(22) Filed: Dec. 26, 2023

(65) Prior Publication Data

US 2024/0222098 A1 Jul. 4, 2024

(30) Foreign Application Priority Data

Dec. 28, 2022 (KR) ........................ 10-2022-0187942

(51) Int. Cl.
*H01J 37/32* (2006.01)
*H10P 72/00* (2026.01)

(52) U.S. Cl.
CPC .. *H01J 37/32935* (2013.01); *H01J 37/32522* (2013.01); *H10P 72/0602* (2026.01); (Continued)

(58) Field of Classification Search
USPC ..................................................... 156/345.27
See application file for complete search history.

(56) References Cited

U.S. PATENT DOCUMENTS 10,910,242 B2 2/2021 Lim et al.
11,041,241 B2 6/2021 Yokota et al.
(Continued)

FOREIGN PATENT DOCUMENTS

JP H1041277 * 2/1998 ......... H01L 21/3065
JP 7106358 B2 7/2022
(Continued)

OTHER PUBLICATIONS

Cengel et al., Heat and Mass Transfer: Fundamentals and Applications 6th edition, chapter 8 including p. 501 (8-30), McGraw-Hill Education, 2020 (previous editions of 2015, 2011 and 2007).
(Continued)

*Primary Examiner* — Ram N Kackar
(74) *Attorney, Agent, or Firm* — Muir Patent Law, PLLC

(57) ABSTRACT

Provided is a chamber temperature control method for controlling a temperature of a chamber that performs processing on a wafer mounted on a support unit by using plasma, the method including: initiating processing on the wafer by using plasma within the chamber, measuring a first fluid temperature when fluid is supplied to the support unit and a second fluid temperature when the fluid is retrieved from the support unit by using a chiller temperature sensor attached to a chiller configured to supply the fluid to the support unit or retrieve the fluid from the support unit through a chiller pipe, determining set temperatures to be compared with reference temperatures of the chamber by determining whether an RF power source for generating the plasma is operating, calculating an error by comparing the set temperatures to the reference temperatures, and adjusting temperatures of heaters.

13 Claims, 6 Drawing Sheets

(52) U.S. Cl.
CPC ... *H01J 37/32082* (2013.01); *H01J 2237/002* (2013.01); *H01J 2237/24585* (2013.01)

(56) References Cited

U.S. PATENT DOCUMENTS

| | | | | |
|---|---|---|---|---|
| 2004/0134612 A1* | 7/2004 | Numata | H10P 72/0602 156/345.33 |
| 2019/0244840 A1* | 8/2019 | Lim | H10P 72/0602 |
| 2021/0351021 A1* | 11/2021 | Silveira | H01J 37/32724 |
| 2022/0068602 A1 | 3/2022 | Kataoka et al. | |

FOREIGN PATENT DOCUMENTS

| | | | |
|---|---|---|---|
| KR | 10-1940287 | B1 | 1/2019 |
| KR | 10-2022-0030902 | A | 3/2022 |
| WO | 1998-011412 | A1 | 3/1998 |

OTHER PUBLICATIONS

"Engine Base Calibration: a Model Based Approach" Mathworks Automotive Conference 2018, Porsche Engineering, Apr. 17, 2018.
Kim et al. "Experimental Investigation of Edge-to-center Density Ratio in Inductively Coupled Plasmas." Physics of Plasmas, vol. 17, No. 7, 2010, pp. 073504-1 to 073504-4.
Lim et. al., "Temperature of a Semiconducting Substrate Exposed to an Inductively Coupled Plasma." Journal of the Korean Physical Society, Aug. 2011, pp. 262-270, vol. 59, No. 2.

* cited by examiner

APPARATUS AND METHOD FOR CONTROLLING TEMPERATURE OF CHAMBER

CROSS-REFERENCE TO RELATED APPLICATION

This application is based on and claims priority under 35 U.S.C. § 119 to Korean Patent Application No. 10-2022-0187942, filed on Dec. 28, 2022, in the Korean Intellectual Property Office, the disclosure of which is incorporated by reference herein in its entirety.

BACKGROUND

1. Field

The inventive concept relates to a chamber temperature control apparatus and a control method thereof, and more particularly, to a chamber temperature control apparatus for controlling the temperature of a chamber which uses plasma to process a wafer provided therein.

2. Description of the Related Art

In a semiconductor manufacturing process, to maintain the quality of a wafer undergoing plasma processing, it is important to adjust the temperature in a processing space to a preset range. When plasma is being generated, it is difficult for a temperature sensor provided in the processing space to directly measure the temperature therein. Thus, the temperature in the processing space is obtained indirectly through estimation or the like.

SUMMARY

The inventive concept provides a chamber temperature control apparatus for estimating the temperature in a processing space where plasma processing is performed, according to changes in conditions therein.

The inventive concept provides a chamber temperature control method for estimating the temperature in a processing space where plasma processing is performed, according to changes in conditions therein.

Additional aspects will be set forth in part in the description which follows and, in part, will be apparent from the description, or may be learned by practice of the presented embodiments of the disclosure.

According to an aspect of the inventive concept, there is provided a chamber temperature control method for controlling the temperature of a chamber that uses plasma to process a wafer mounted on a support unit, the method including initiating processing on the wafer by using plasma within the chamber, measuring a first fluid temperature when fluid is supplied to the support unit and a second fluid temperature when the fluid is retrieved from the support unit by using a chiller temperature sensor attached to a chiller configured to supply fluid to the support unit or retrieve fluid from the support unit through a chiller pipe, determining set temperatures to be compared with reference temperatures of the chamber by determining whether an RF power source for generating the plasma is operating, calculating an error by comparing the set temperatures to the reference temperatures, and adjusting temperatures of heaters provided in the chamber based on the calculated error.

According to an embodiment, in the determining of the set temperatures to be compared with the reference temperatures of the chamber by determining whether the RF power source for generating the plasma is operating, when the RF power source is operating, a plurality of predicted temperatures are calculated using a plurality of temperature functions which use the first fluid temperature and the second fluid temperature as variables, and then the calculated plurality of predicted temperatures are determined as the set temperatures.

According to an embodiment, the plurality of predicted temperatures of the chamber include a predicted temperature of an upper portion of the chamber, a predicted temperature of a sidewall portion of the chamber, and a predicted temperature of a lower portion of the chamber.

According to an embodiment, the temperature functions include a first temperature function for measuring a temperature of an upper portion of the chamber, a second temperature function for measuring a temperature of a sidewall portion of the chamber, and a third temperature function for measuring a temperature of a lower portion of the chamber.

$$T_2 = T_B - (T_B - T_1)\exp\left(\frac{-2\pi hD}{\dot{M}_c * c_g} * L\right) \quad \text{[Equation 1]}$$

According to an embodiment, the first temperature function follows Equation 1 above, and in Equation 1, $T_1$ refers to a first fluid temperature, $T_2$ refers to a second fluid temperature, $T_B$ refers to a predicted temperature of the lower portion of the chamber, h refers to a heat transfer coefficient, D refers to a diameter of the chiller pipe, L refers to a total length of the chiller pipe, $\dot{M}_c$ refers to a mass flow rate of the fluid, and $c_g$ refers to a specific heat capacity of the fluid.

$$m_{c,w} * c_p * (T_{w,t} - T_{w,0}) = -hA_w(T_{w,0} - 25) * dt + B * dt + q''_p * A * dt \quad \text{[Equation 2]}$$

According to an embodiment, the second temperature function follows Equation 2 above, and in Equation 2, $m_{c,w}$ refers to a mass of the sidewall portion of the chamber, $c_P$ refers to a specific heat capacity of the chamber, $T_{w,0}$ refers to a measured temperature of the sidewall portion of the chamber, h refers to a heat transfer coefficient, B refers to a power of the heater, $T_{w,t}$ refers to a predicted temperature of the sidewall portion of the chamber, $q''_p$ refers to a heat flux of the plasma, $A_w$ refers to an area of the sidewall portion of the chamber, and A refers to a total area of the chamber.

$$m_{c,t} * c_p * (T_{t,t} - T_{t,0}) = -hA_t(T_{t,0} - 25) * dt + B * dt + q''_p * A * dt \quad \text{[Equation 3]}$$

According to an embodiment, the third temperature function follows Equation 3 above, and in Equation 3, $m_{c,t}$ refers to a mass of the upper portion of the chamber, $c_P$ refers to a specific heat capacity of the chamber, $T_{t,0}$ refers to a measured temperature of the upper portion of the chamber, h refers to a heat transfer coefficient, B refers to a power of the heater, $T_{t,t}$ refers to a predicted temperature of the upper portion of the chamber, $q''_p$ refers to a heat flux of the plasma, $A_t$ refers to an area of the upper portion of the chamber, and A refers to a total area of the chamber.

According to an embodiment, in the determining of the set temperatures to be compared with the reference temperatures of the chamber by determining whether the RF power source for generating the plasma is operating, when the RF power is not operating, temperatures of a plurality of sensing points of the chamber measured by a plurality of chamber temperature sensors attached to the chamber are determined as the set temperatures.

According to an embodiment, the plurality of chamber temperature sensors include a first chamber temperature sensor attached to an upper portion of the chamber, a second chamber temperature sensor attached to a sidewall portion of the chamber, and a third chamber temperature sensor attached to a lower portion of the chamber.

According to an embodiment, the calculating of the error by comparing the set temperatures to the reference temperatures is performed by a PID controller.

According to another aspect of the inventive concept, there is provided a chamber temperature control apparatus for controlling the temperature of a chamber that uses plasma to process a wafer mounted on a support unit, the apparatus including an RF power source positioned within the chamber and configured to supply RF power to generate the plasma, a chiller configured to supply fluid to or retrieve fluid from the support unit, a chiller temperature sensor attached to the chiller and configured to measure the temperature of the fluid, a plurality of chamber temperature sensors attached to the chamber and configured to each measure the temperature of a specific point in the chamber, and a processor configured to determine set temperatures to be compared with reference temperatures of the chamber by determining whether the RF power source is operating.

According to an embodiment, the plurality of chamber temperature sensors include a first chamber temperature sensor attached to an upper portion of the chamber and configured to measure a temperature of the upper portion of the chamber, a second chamber temperature sensor attached to a sidewall portion of the chamber and configured to measure a temperature of the sidewall portion of the chamber, and a third chamber temperature sensor attached to a lower portion of the chamber and configured to measure a temperature of the lower portion of the chamber.

According to an embodiment, the first chamber temperature sensor, the second chamber temperature sensor, and the third chamber temperature sensor each transmit a measured temperature value to the processor.

According to an embodiment, the processor includes a PID controller configured to calculate an error by comparing the set temperatures and the reference temperatures.

According to an embodiment, the apparatus further includes a plurality of heaters attached to the inside of the chamber, the processor further includes a control unit configured to control the plurality of heaters to supply heat to the inside of the chamber, and the control unit is configured to receive the error from the PID controller and determine whether to supply heat to the plurality of heaters.

According to an embodiment, the plurality of heaters include a first heater installed at an upper portion of the chamber, a second heater installed at a sidewall portion of the chamber, and a third heater installed at a lower portion of the chamber.

According to an embodiment, the fluid includes an inert fluid.

According to another aspect of the inventive concept, there is provided a chamber temperature control apparatus for controlling the temperature of a chamber that uses plasma to process a wafer mounted on a support unit, the apparatus including an RF power source positioned within the chamber and configured to supply RF power to generate the plasma, a chiller configured to supply fluid to or retrieve fluid from the support unit, a chiller temperature sensor attached to the chiller and configured to measure the temperature of the fluid, a plurality of chamber temperature sensors attached to the chamber and configured to each measure the temperature of a specific point in the chamber, a processor configured to determine set temperatures to be compared with reference temperatures of the chamber by determining whether the RF power source is operating, a plurality of heaters attached inside the chamber, wherein the plurality of chamber temperature sensors include a first chamber temperature sensor attached to an upper portion of the chamber and configured to measure a temperature of the upper portion of the chamber, a second chamber temperature sensor attached to a sidewall portion of the chamber and configured to measure a temperature of the sidewall portion of the chamber, and a third chamber temperature sensor attached to a lower portion of the chamber and configured to measure a temperature of the lower portion of the chamber, wherein the plurality of heaters include a first heater installed at the upper portion of the chamber, a second heater installed at the sidewall portion of the chamber, and a third heater installed at the lower portion of the chamber.

According to an embodiment, the processor includes a PID controller configured to calculate an error by comparing the set temperatures and the reference temperatures, a control unit configured to control the plurality of heaters to supply heat to the inside of the chamber, and a reference value input unit configured to input the reference temperatures.

According to an embodiment, the first chamber temperature sensor, the second chamber temperature sensor, and the third chamber temperature sensor each transmit a measured temperature value to the processor.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
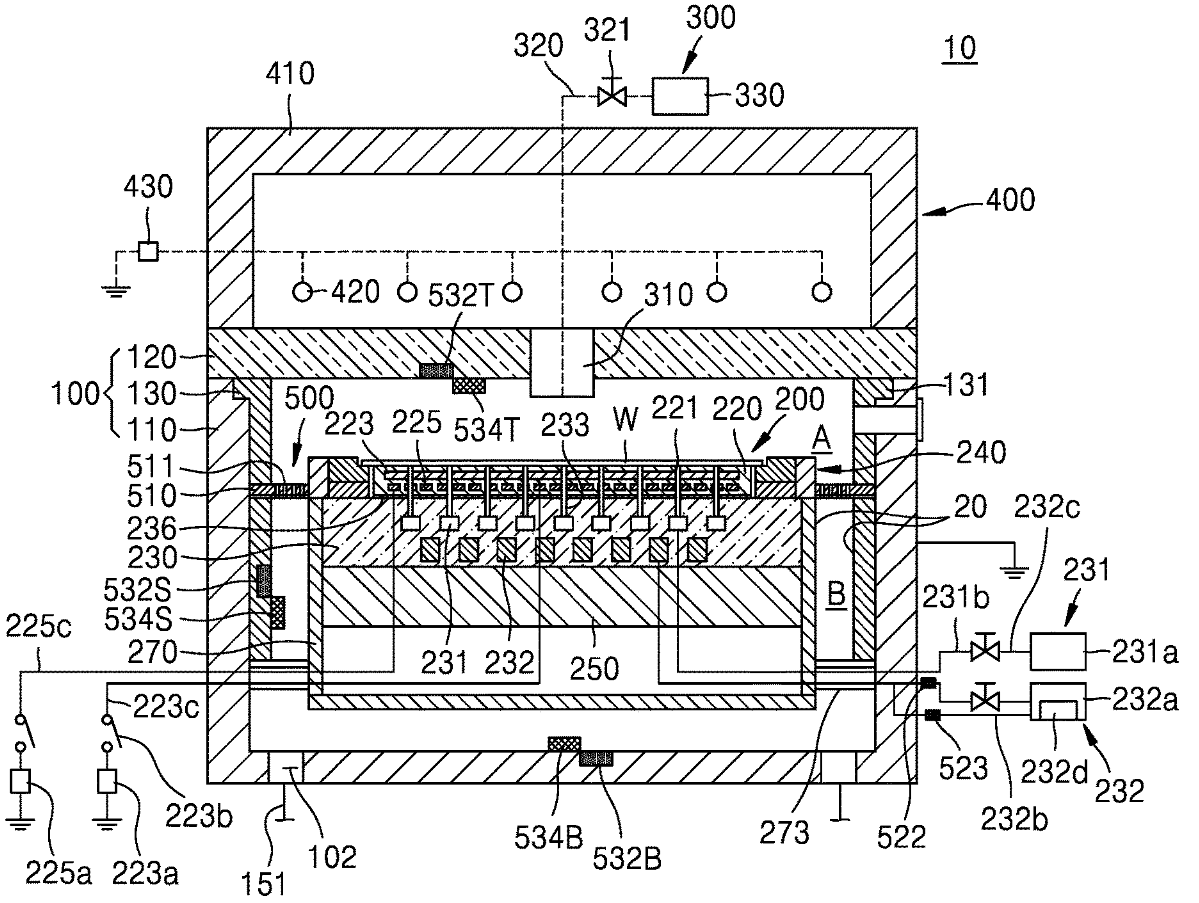
FIG. 1 is a cross-sectional view of a chamber temperature control apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments are described in detail with reference to the accompanying drawings. However, the disclosure does not have to be configured as limited to the embodiments described below and may be embodied in various other forms. The following embodiments are not provided to fully complete the disclosure, but rather are provided to fully convey the scope of the disclosure to those skilled in the art.

FIG. 1 is a cross-sectional view of a chamber temperature control apparatus according to an embodiment.

Referring to FIG. 1, a chamber 100 of a chamber temperature control apparatus 10 processes a wafer W by using plasma. For example, the chamber 100 may perform an etching process on the wafer W. The chamber temperature control apparatus 10 may include the chamber 100, a support unit 200, a gas supply unit 300, a plasma source 400, and an exhaust unit 500.

The chamber 100 has a processing space therein for processing the wafer W. The chamber 100 includes a lower portion 110, an upper portion 120, and a sidewall portion 130.

The chamber's lower portion 110 has a space inside with an open top. The internal space of the chamber's lower portion 110 may be provided as a processing space where wafer processing is performed. The chamber's lower portion 110 may include metal or aluminum. The chamber's lower portion 110 may be grounded. Exhaust holes 102 may be formed on the bottom of the lower portion 110 of the chamber 110, and the exhaust holes 102 may be connected to an exhaust line 151. Reaction by-products generated during processing and fluid remaining in the internal space of the chamber's lower portion 110 may be discharged to the outside through the exhaust line 151. Through the exhaust process, the inside of the chamber's lower portion 110 is depressurized to a preset pressure.

The chamber's upper portion 120 covers the open top of the chamber's lower portion 110. The chamber's upper portion 120 is provided in a plate shape and seals the internal space of the chamber's lower portion 110. The chamber's upper portion 120 may include a dielectric substance window.

The chamber's sidewall portion 130 is provided inside the chamber's lower portion 110. However, it is not necessarily limited to the above, and the chamber's sidewall portion 130 may be a part of the chamber's lower portion 110, not separate from the chamber's lower portion 110. The chamber's sidewall portion 130 has an internal space with an open top and an open bottom. The chamber's sidewall portion 130 may be provided in a cylindrical shape. The chamber's sidewall portion 130 may have a radius corresponding to the inner surface of the chamber's lower portion 110. The chamber's sidewall portion 130 is provided along the inner surface of the chamber's lower portion 110. A support ring 131 is formed on top of the chamber's sidewall portion 130.

The support ring 131 is provided as a ring-shaped plate and protrudes outward from the chamber's sidewall portion 130 along the circumference of the chamber's sidewall portion 130. The support ring 131 is placed on top of the chamber's lower portion 110 and supports the chamber's sidewall portion 130. The chamber's sidewall portion 130 may include the same material as the chamber's lower portion 110. The chamber's sidewall portion 130 may include metal or aluminum. The chamber's sidewall portion 130 protects the inner surface of the chamber's lower portion 110. For example, in the process of exciting process gas, an arc discharge may occur inside the chamber 100. The arc discharge damages peripheral devices. The chamber's sidewall portion 130 protects the inner surface of the chamber's lower portion 110 and prevents the inner surface of the chamber's lower portion 110 from being damaged by the arc discharge. Additionally, reaction by-products generated during wafer processing are prevented from being deposited on the inner wall of the chamber's lower portion 110. The chamber's sidewall portion 130 is less expensive and easier to replace than the chamber's lower portion 110. Therefore, when the chamber's sidewall portion 130 is damaged due to the arc discharge, an operator may replace the chamber's sidewall portion 130 with a new one.

The gas supply unit 300 supplies process gas to the processing space inside the chamber 100. As an example, the gas supply unit 300 may include a gas supply nozzle 310, a gas supply line 320, and a gas storage 330.

The gas supply nozzle 310 is installed at the center of the chamber's upper portion 120. An injection hole is formed on the bottom of the gas supply nozzle 310. The injection hole is located below the chamber's upper portion 120 and supplies process gas into the chamber 100. The gas supply line 320 connects the gas supply nozzle 310 to the gas storage 330. The gas supply line 320 supplies the process gas stored in the gas storage 330 to the gas supply nozzle 310. A valve 321 is installed in the gas supply line 320. The valve 321 opens and closes the gas supply line 320 and controls the flow rate of the process gas supplied through the gas supply line 320.

The plasma source 400 generates plasma from the process gas supplied into the processing space inside the chamber 100. The plasma source 400 is provided outside the processing space of the chamber 100. According to an embodiment, an inductively coupled plasma (ICP) source may be used as the plasma source 400.

According to another embodiment, a capacitively coupled plasma (CCP) source may be used as the plasma source 400.

According to an embodiment, the plasma source 400 includes an antenna chamber 410, an antenna 420, and an RF power source 430. The antenna chamber 410 is provided in a cylindrical shape with an open bottom. The antenna chamber 410 is provided with a space therein. The antenna chamber 410 has a diameter corresponding to that of the chamber 100. A lower end of the antenna chamber 410 is detachable from the chamber's upper portion 120. The antenna 420 is located inside the antenna chamber 410.

The antenna 420 is provided as a spiral-shaped coil with multiple turns and is connected to the RF power source 430. The antenna 420 receives power from the RF power source 430. The RF power source 430 may be located outside the chamber 100. The antenna 420 to which power is applied may form an electromagnetic field in the processing space of the chamber 100. The process gas is excited into a plasma state by the electromagnetic field.

According to another embodiment, unlike shown in FIG. 1, the plasma source 400 may include a showerhead and an upper electrode, each located on top of the chamber 100.

The support unit 200 supports the wafer W within the processing space inside the chamber 100. For example, the support unit 200 is located inside the chamber's lower portion 110. The support unit 200 supports the wafer W. The support unit 200 may be provided as an electrostatic chuck that adsorbs the wafer W using electrostatic force. Alternatively, the support unit 200 may support the wafer W in various ways, such as mechanical clamping. Hereinafter, the support unit 200 provided as the electrostatic chuck is described.

The support unit 200 includes chucks 220, 230, and 250, and an edge ring 240.

The chucks 220, 230, and 250 support the wafer W during processing. The chucks 220, 230, and 250 include a support plate 220, a flow path forming plate 230, and an insulating plate 250.

The support plate 220 is located at an upper portion of the support unit 200. The support plate 220 is provided as a disc-shaped dielectric substance. The wafer W is placed on an upper surface of the support plate 220. The upper surface of the support plate 220 has a smaller radius than the wafer W. In the support plate 220, a first supply flow path 221 to be used as a passage through which heat transfer fluid is supplied to the bottom of the wafer W is formed. An electrostatic electrode 223 and a heater 225 are embedded in the support plate 220.

The electrostatic electrode 223 is located on top of the heater 225. The electrostatic electrode 223 is electrically connected to a first lower power source 223*a*. The electrostatic force acts between the electrostatic electrode 223 and the wafer W due to the current applied to the electrostatic electrode 223, and the wafer W is adsorbed to the support plate 220 by the electrostatic force.

The heater 225 is electrically connected to a second lower power source 225*a*. The heater 225 generates heat by resisting the current applied from the second lower power source 225*a*. The generated heat is transferred to the wafer W through the support plate 220. The temperature of the wafer W is maintained at a set temperature by the heat generated by the heater 225. The heater 225 includes a spiral-shaped coil. The flow path forming plate 230 is located below the support plate 220. The bottom of the support plate 220 may be bonded to the top of the flow path forming plate 230 by using an adhesive 236.

The flow path forming plate 230 may be located below the support plate 220.

The flow path forming plate 230 includes circulation flow paths 231, chillers 232, and second supply flow paths 233. The circulation flow path 231 is provided as a passage through which the heat transfer fluid circulates. The chiller 232 provides chiller pipes 232*b* and 232*c* through which cooling fluid is supplied. The chiller pipes 232*b* and 232*c* include a cooling fluid exhaust line 232*b* and a cooling fluid supply line 232*c*. The second supply flow path 233 connects the circulation flow path 231 and the first supply flow path 221. The circulation flow path 231 is provided as a passage through which the heat transfer fluid circulates. The circulation flow paths 231 may be formed in a spiral shape inside the flow path forming plate 230. Alternatively, the circulation flow paths 231 may be arranged so that ring-shaped flow paths with different radii have the same center. The circulation flow paths 231 may communicate with each other. The circulation flow paths 231 are formed at the same height.

The circulation flow path 231 is connected to a heat transfer medium storage 231*a* through a heat transfer medium supply line 231*b*. A heat transfer medium is stored in the heat transfer medium storage 231*a*. The heat transfer medium includes an inert fluid. According to an embodiment, the heat transfer medium includes a fluid containing helium (He). The fluid containing He is supplied to the circulation flow path 231 through the heat transfer medium supply line 231*b*, and is supplied to the bottom of the wafer W through the second supply flow path 233 and the first supply flow path 221 sequentially. The fluid containing He functions as a medium to aid heat exchange between the wafer W and the support plate 220. Therefore, the overall temperature of the wafer W becomes uniform.

The chiller 232 includes a cooling fluid storage 232*a* connected to the cooling fluid supply line 232*c*. A cooling fluid is stored in the cooling fluid storage 232*a*. A cooler 232*d* may be provided within the cooling fluid storage 232*a*. The cooler 232*d* cools the cooling fluid to a preset temperature. Alternatively, the cooler 232*d* may be installed on the cooling fluid supply line 232*c*. The cooling fluid supplied to the chiller 232 through the cooling fluid supply line 232*c* circulates along the chiller 232 and cools the flow path forming plate 230. As the flow path forming plate 230 is cooled, the support plate 220 and the wafer W are cooled together to maintain the temperature of the wafer W at a preset temperature. The cooling fluid that cooled the flow path forming plate 230 may move back to the chiller 232 through the cooling fluid exhaust line 232*b*. For the reasons described above, generally, a lower part of the edge ring 240 is provided at a lower temperature than an upper part thereof.

The insulating plate 250 is located below the flow path forming plate 230. The insulating plate 250 includes an insulating material and electrically insulates the flow path forming plate 230 and a lower cover 270.

The lower cover 270 is located below the support unit 200. The lower cover 270 is spaced upward from the bottom of the chamber's lower portion 110. A space with an open top is formed inside the lower cover 270. The top of the lower cover 270 is covered by the insulating plate 250. Accordingly, the outer radius of the cross-section of the lower cover 270 may be the same length as the outer radius of the insulating plate 250. A lift pin, etc. may be located in the internal space of the lower cover 270 to receive the transported wafer W from an external transport member and seat the wafer W on the support plate 220.

The lower cover 270 has a connecting member 273. The connecting member 273 connects the outer surface of the lower cover 270 to the inner wall of the chamber's lower portion 110. A plurality of connecting members 273 may be provided on the outer surface of the lower cover 270 at regular intervals. The connection members 273 support the support unit 200 inside the chamber 100. Additionally, the connection members 273 are connected to the inner wall of the chamber's lower portion 110, thereby allowing the lower cover 270 to be electrically grounded. A first power line 223*c* connected to the first lower power source 223*a*, a second power line 225*c* connected to the second lower power source 225*a*, the heat transfer medium supply line 231*b* connected to the heat transfer medium storage 231*a*, and a cooling fluid supply line 232*c* connected to the cooling fluid storage 232*a* extend into the lower cover 270 through the internal space of the connecting member 273.

The exhaust unit 500 is located between the support unit 200 and the inner wall of the chamber's lower portion 110. The exhaust unit 500 includes an exhaust plate 510 in which through holes 511 are formed. The exhaust plate 510 is provided in an annular ring shape. The plurality of through holes 511 are formed in the exhaust plate 510. The process gas provided in the chamber's lower portion 110 passes through the through holes 511 of the exhaust plate 510 and is exhausted to the exhaust holes 102. The flow of process gas may be controlled depending on the shape of the exhaust plate 510 and the shape of the through holes 511.

For reference, the internal space of the chamber's lower portion 110 may be divided into a plasma space A corresponding to an upper space of the exhaust plate 510 and an exhaust space B corresponding to a lower space of the exhaust plate 510.

The chamber's lower portion 110 and the support unit 200, each exposed to the exhaust space B, may include water-repellent coating parts 20. The water-repellent coating parts 20 may include aluminum.

According to an embodiment, the chamber temperature control apparatus 10 may include a plurality of temperature sensors 532T, 532S, and 532B, and a plurality of heaters 534T, 534S, and 534B, a detailed description of which is provided below.

Figure 2:
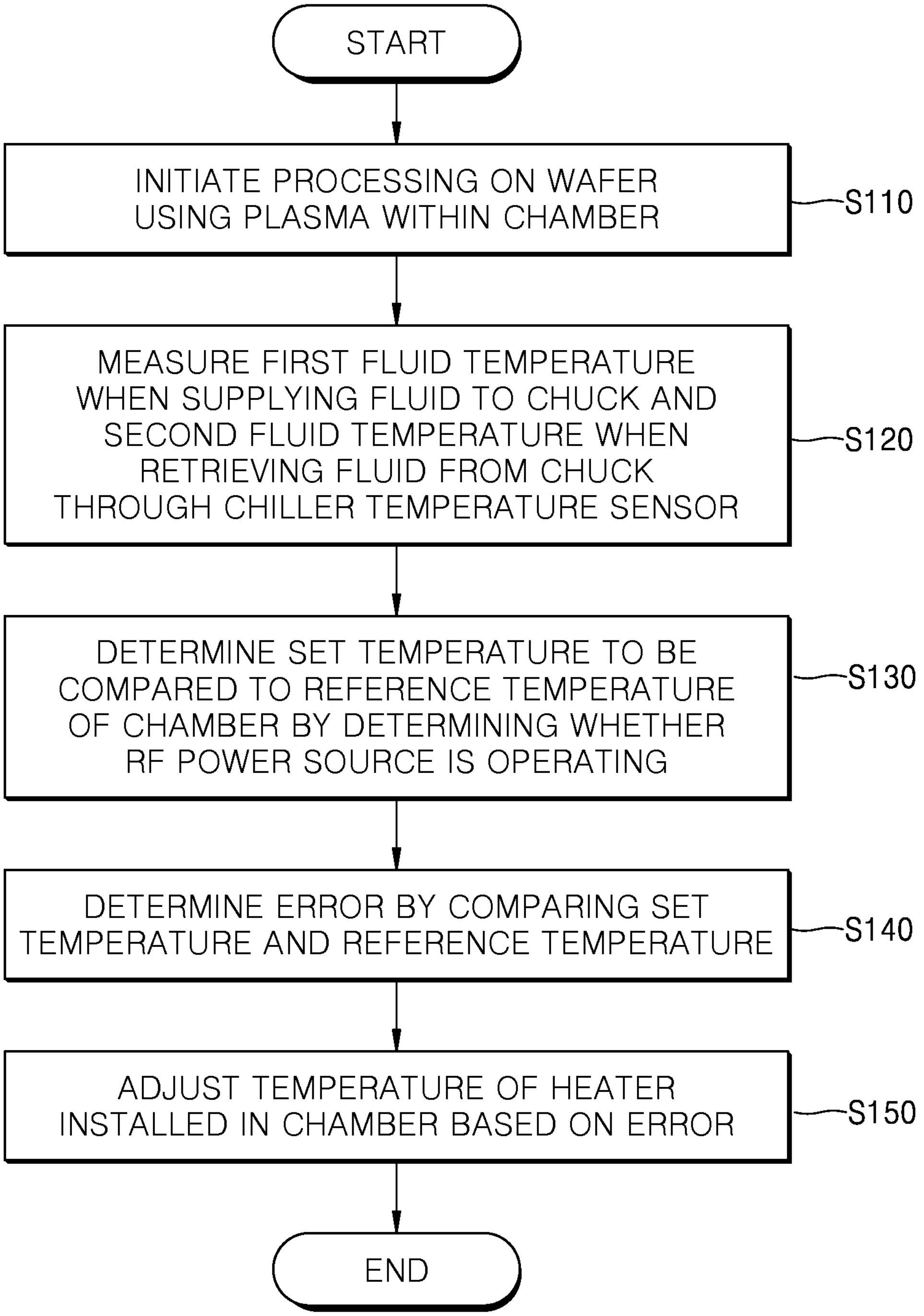
FIG. 2 is a control method of a chamber temperature control apparatus according to an embodiment.
Figure 3:
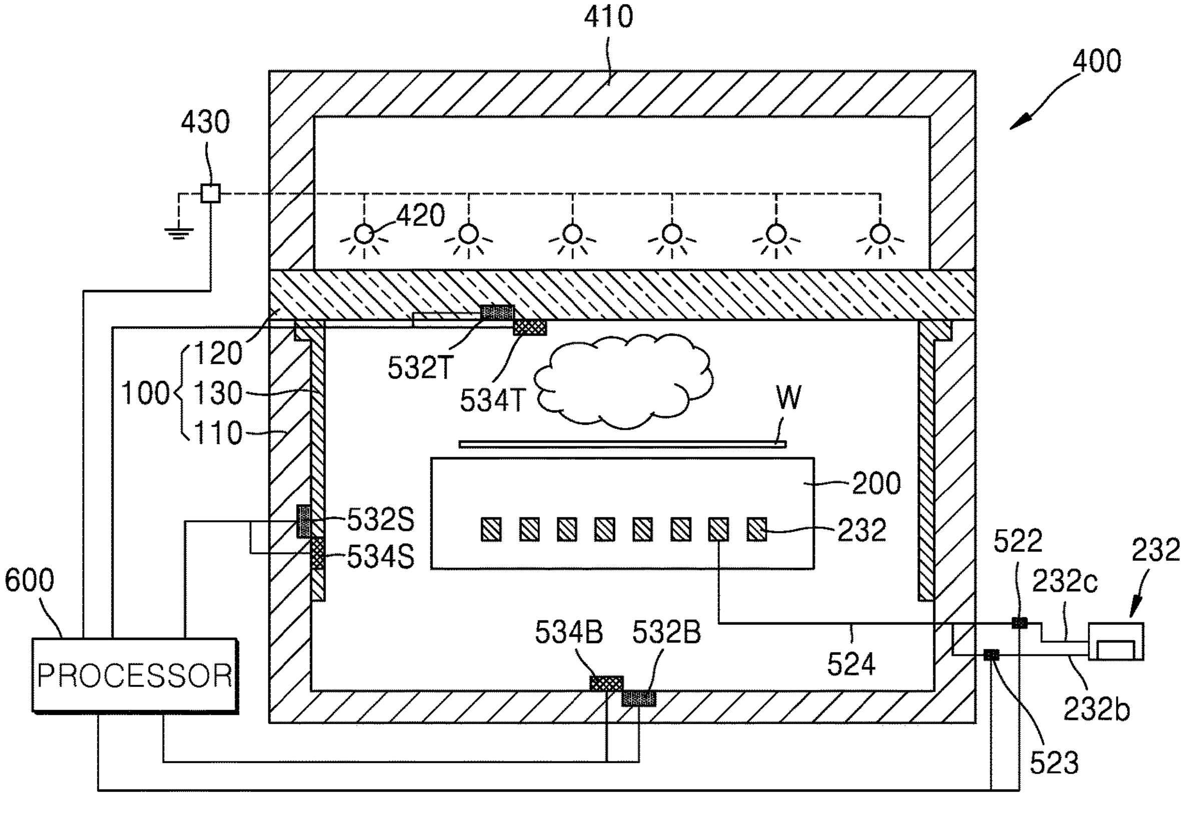
FIGS. 3, 4, and 5 are schematic diagrams for illustrating a chamber temperature control method according to an embodiment.
Figure 4:
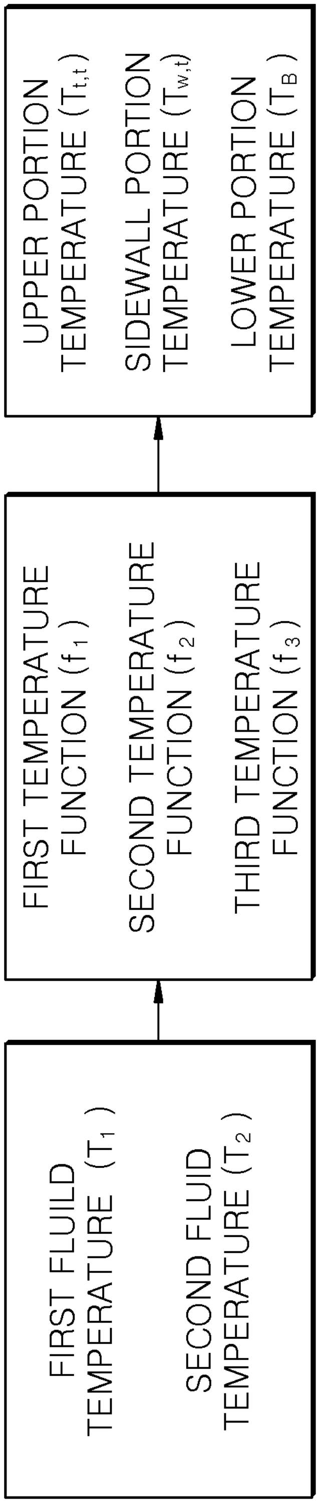
Figure 5:
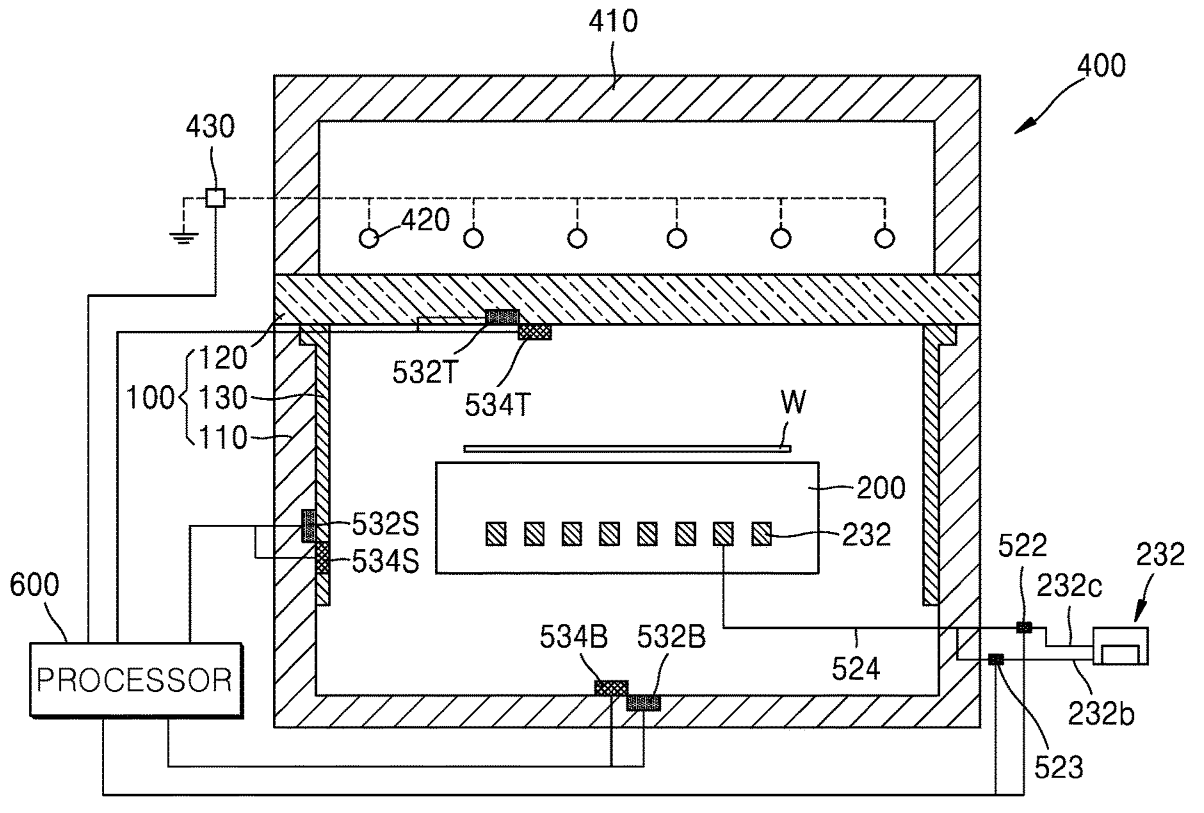

FIG. 2 is a control method of a chamber temperature control apparatus according to an embodiment. FIGS. 3, 4, and 5 are schematic diagrams for illustrating a chamber temperature control method according to an embodiment.

Hereinafter, FIG. 2 is described with reference to FIGS. 3, 4, and 5. A chamber temperature control method for performing a process on the wafer W mounted on the support unit 200 by using plasma includes stage S110, stage S120, stage S130, stage S140, and stage S150. In stage S110, processing on the wafer W is initiated using plasma within the chamber 100.

Thereafter, in stage S120, using chiller temperature sensors 522 and 523 attached to the chiller 232 configured to supply fluid to the support unit 200 or retrieve fluid from the support unit 200 through the chiller pipes 232*b* and 232*c*, a first fluid temperature $T_1$ when the fluid is supplied to the support unit 200 and a second fluid temperature $T_2$ when the fluid is retrieved from the support unit 200 may be measured.

Specifically, when supplying fluid to the support unit 200 through the first chiller temperature sensor 522 attached to the cooling fluid supply line 232*c* of the chiller 232 that supplies fluid to the support unit 200, the first fluid temperature $T_1$ may be measured. In addition, when discharging fluid from the support unit 200 through the second chiller temperature sensor 523 attached to the cooling fluid exhaust line 232*b* of the chiller 232 that retrieves fluid from the support unit 200, the second fluid temperature $T_2$ may be measured.

Thereafter, in stage S130, the set temperatures to be compared with the reference temperatures of the chamber 100 are determined by determining whether the RF power source 430 is operating.

As shown in FIG. 4, when the RF power 430 is operating, a plurality of predicted temperatures $T_{t,t}$, $T_{w,t}$, and $T_B$ may be calculated by using a plurality of temperature functions $f_1$, $f_2$, and $f_3$ which use the first fluid temperature $T_1$ when fluid is supplied to the support unit 200 and the second fluid temperature $T_2$ when fluid is retrieved from the support unit 200 as variables. Thereafter, the calculated plurality of predicted temperatures $T_{t,t}$, $T_{w,t}$, and $T_B$ may be determined as the set temperatures.

According to an embodiment, the plurality of predicted temperatures $T_{t,t}$, $T_{w,t}$, and $T_B$ may include a predicted temperature $T_{t,t}$ of the upper portion 120 of the chamber 100, a predicted temperature $T_{w,t}$ of the chamber's sidewall portion 130, and a predicted temperature $T_B$ of the lower portion 110 of the chamber 100.

According to an embodiment, the plurality of temperature functions $f_1$, $f_2$, and $f_3$ may include a first temperature function $f_1$ for measuring a temperature of the chamber's upper portion 120, a second temperature function $f_2$ for measuring a temperature of the chamber's sidewall portion 130, and a third temperature function $f_3$ for measuring a temperature of the chamber's lower portion 110.

$$T_2 = T_B - (T_B - T_1)\exp\left(\frac{-2\pi hD}{\dot{M}_c * c_g} * L\right) \quad \text{[Equation 1]}$$

The first temperature function $f_1$ may follow Equation 1 above.

In Equation 1, $T_1$ may refer to a first fluid temperature $T_1$, $T_2$ may refer to a second fluid temperature $T_2$, $T_B$ may refer to a predicted temperature of the lower portion of the chamber $T_B$, h may refer to a heat transfer coefficient, D may refer to a diameter of the chiller pipe, L may refer to the total length of the chiller pipe, $\dot{M}_c$ may refer to a mass flow rate of the fluid, and $c_g$ may refer to a specific heat capacity of the fluid. The predicted temperature $T_B$ of the lower portion of the chamber may be obtained through Equation 1 above.

$$m_{c,w} * c_p * (T_{w,t} - T_{w,0}) = -hA_w(T_{w,0} - 25) * dt + B * dt + q''_p * A * dt \quad \text{[Equation 2]}$$

The second temperature function $f_2$ may follow Equation 2 above.

In Equation 2, $m_{c,w}$ may refer to a mass of the sidewall portion of the chamber, $c_P$ may refer to a specific heat capacity of the chamber, $T_{w,0}$ may refer to a measured temperature of the sidewall portion of the chamber, h may refer to a heat transfer coefficient, B may refer to a power of the heater, $T_{w,t}$ may refer to a predicted temperature of the sidewall portion of the chamber, $q''_p$ may refer to a heat flux of the plasma, $A_w$ may refer to an area of the sidewall portion of the chamber, and A may refer to a total area of the chamber. The predicted temperature $T_{w,t}$ of the sidewall portion of the chamber may be obtained through Equation 2 above.

$$m_{c,t} * c_p * (T_{t,t} - T_{t,0}) = -hA_t(T_{t,0} - 25) * dt + B * dt + q''_p * A * dt \quad \text{[Equation 3]}$$

The third temperature function $f_3$ may follow Equation 3 above.

In Equation 3, $m_{c,t}$ may refer to a mass of the upper portion of the chamber, $c_P$ may refer to a specific heat capacity of the chamber, $T_{t,0}$ may refer to a measured temperature of the upper portion of the chamber, h may refer to a heat transfer coefficient, B may refer to a power of the heater, $T_{t,t}$ may refer to a predicted temperature of the upper portion of the chamber, $q''_p$ may refer to a heat flux of the plasma, $A_t$ may refer to an area of the upper portion of the chamber, and A may refer to a total area of the chamber. The predicted temperature $T_{t,t}$ of the upper portion of the chamber may be obtained through Equation 3 above.

According to an embodiment, the plurality of chamber temperature sensors 532T, 532S, and 532B may include a first chamber temperature sensor 532T attached to the chamber's upper portion 120, a second chamber temperature sensor 532S attached to the chamber's sidewall portion 130, and a third chamber temperature sensor 532B attached to the chamber's lower portion 110. The first chamber temperature sensor 532T may measure a temperature $T_{t,0}$ of the chamber's upper portion 120 and then transmit the value to the processor 600. The second chamber temperature sensor 532S may measure a temperature $T_{w,0}$ of the chamber's sidewall portion 130 and then transmit the value to the processor 600.

As shown in FIG. 5, when the RF power 430 is not operating, the temperatures of a plurality of sensing points measured by the first chamber temperature sensor 532T attached to the chamber's upper portion 120, the second chamber temperature sensor 532S attached to the chamber's sidewall portion 130, and the third chamber temperature sensor 532B attached to the chamber's lower portion 110, respectively, may be set as set temperatures.

Referring again to FIG. 2, in stage S140, an error may be determined by comparing the set temperatures with the reference temperatures. Stage S140 of calculating the error by comparing the set temperatures with the reference temperatures may be performed by a PID controller 602 (see FIG. 6).

Thereafter, in stage S150, the temperatures of the plurality of heaters 534T, 534S, and 534B provided in the chamber 100 may be adjusted based on the calculated error. The plurality of heaters 534T, 534S, and 534B include a first heater 534T positioned at the chamber's upper portion 120, a second heater 534S positioned at the chamber's sidewall portion 130, and a third heater 534B positioned at the chamber's lower portion 110.

Figure 6:
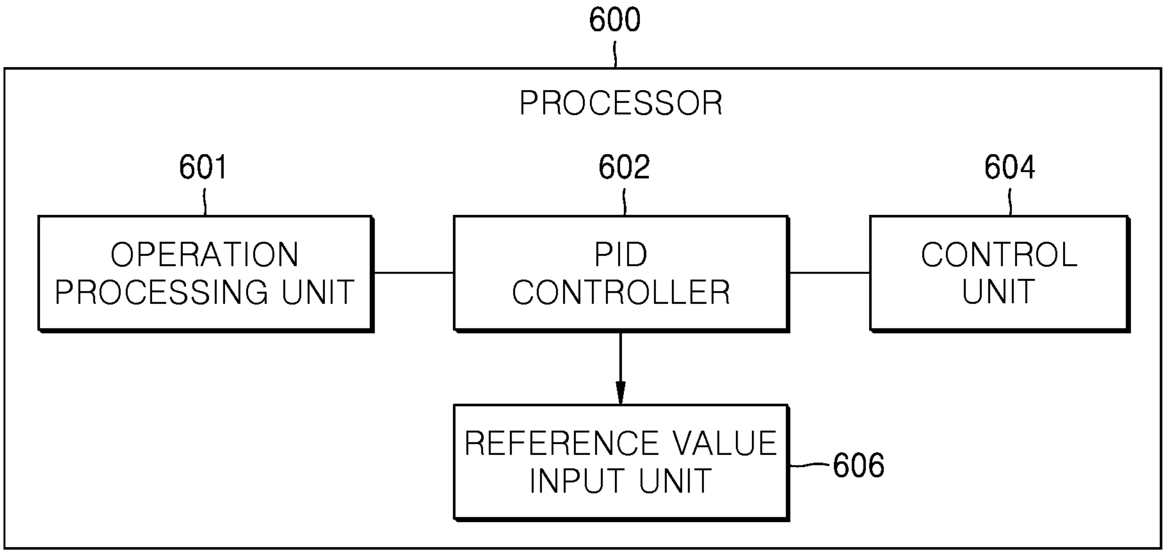
FIG. 6 is a schematic block diagram of a processor included in a chamber, according to an embodiment.

FIG. 6 is a schematic block diagram of a processor included in a chamber according to an embodiment.

The phrase "processor configured (or set) to perform A, B, and C" may refer to a dedicated processor (e.g., embedded processor, MCU) to perform the corresponding operations, or a general-purpose processor (e.g., CPU, AP) to perform the corresponding operations by executing one or more software programs stored in memory.

Referring to FIG. 6, the processor 600 may include an operation processing unit 601, a PID controller 602, a control unit 604, and a reference value input unit 606. The operation processing unit 601, as shown in FIG. 4, may calculate the upper portion temperature $T_{t,t}$, the sidewall portion temperature $T_{w,t}$, and the lower portion temperature $T_B$ when the first fluid temperature $T_1$ and the second fluid temperature $T_2$ are input into each of the first temperature function $f_1$, the second temperature function $f_2$, and the third temperature function $f_3$. In addition, the operation processing unit 601 may determine the plurality of predicted temperatures $T_{t,t}$, $T_{w,t}$, and $T_B$ or the temperatures measured by the plurality of sensors 532T, 532S, and 532B as set temperatures depending on whether the RF power source 430 is operating. The PID controller 602 may be configured to calculate an error by comparing the set temperatures with the reference temperatures. The reference value input unit 606 may set the reference temperatures. the control unit 604 may adjust the temperatures of the plurality of heaters 534T, 534S, and 534B provided in the chamber 100 based on the error calculated by the PID controller 602.

The control unit 604 may be implemented as hardware, firmware, software, or any combination thereof. For example, the control unit 604 may include a computer device such as a workstation computer, a desktop computer, a laptop computer, or a tablet computer. For example, the control unit 604 includes a memory device such as read only memory (ROM) and random access memory (RAM), and a processor configured to perform preset operations and algorithms, such as a microprocessor, a central processing unit (CPU), a graphics processing unit (GPU), and the like.

Hereinafter, the components of the chamber temperature control apparatus 10 according to an embodiment shown in FIGS. 3 and 5 are described.

The chamber temperature control apparatus 10 for controlling the temperature of the chamber 100 that uses plasma to perform processing on the wafer W mounted on the support unit 200 may include the RF power source 430 positioned within the chamber 100 and configured to supply RF power to generate plasma.

Additionally, the chamber temperature control apparatus 10 may include the chiller 232 configured to supply fluid to or retrieve fluid from the support unit 200.

According to an embodiment, the chamber temperature control apparatus 10 may include the chiller temperature sensor 522 and 523 attached to the chiller 232 and configured to measure the temperature of the fluid. The plurality of chiller temperature sensors 522 and 523 may be provided and may include a first chiller temperature sensor 522 and a second chiller temperature sensor 523. Specifically, when supplying fluid to the support unit 200 through the first chiller temperature sensor 522 attached to the cooling fluid supply line 232*c* of the chiller 232 that supplies fluid to the support unit 200, the first fluid temperature $T_1$ may be measured. In addition, when discharging fluid from the support unit 200 through the second chiller temperature sensor 523 attached to the cooling fluid exhaust line 232*b* of the chiller 232 that retrieves fluid from the support unit 200, the second fluid temperature $T_2$ may be measured.

According to an embodiment, the chamber temperature control apparatus 10 may include the plurality of chamber temperature sensors 532T, 532S, and 532B attached to the chamber 100 and configured to each measure the temperature of a specific point of the chamber 100. The plurality of chamber temperature sensors 532T, 532S, and 532 may include the first chamber temperature sensor 532T attached to the chamber's upper portion 120 and configured to measure the temperature of the chamber's upper portion 120, the second chamber temperature sensor 532S attached to the chamber's sidewall portion and configured to measure the temperature of the chamber's sidewall portion 130, and the third chamber temperature sensor 532B attached to the chamber's lower portion 110 and configured to measure the temperature of the chamber's lower portion 110.

According to the inventive concept, it is possible to provide a chamber temperature control apparatus and a control method of the same for estimating the temperature in a processing space where plasma processing is performed, according to changes in conditions therein.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A chamber temperature control apparatus for controlling a temperature of a chamber that uses plasma to process a wafer mounted on a support unit, the apparatus comprising:

an RF power source positioned within the chamber and configured to supply RF power to generate the plasma;

a plurality of heaters attached inside the chamber:

a chiller configured to supply fluid to or retrieve fluid from the support unit;

a first temperature sensor source including temperature sensors attached to supply and retrieval lines of the chiller;

a second temperature sensor source including temperature sensors attached to the chamber; and a processor configured to determine set temperatures to be compared with reference temperatures of the chamber by determining whether the RF power source is operating, wherein:

the processor is configured to;

determine the set temperatures based on data from the first temperature sensor source when the RF power source is operating;

determine the set temperatures based on data from the second temperature sensor source when the RF power source is not operating; and control the plurality of heaters based on a comparison of the set temperatures and the reference temperatures.

2. The apparatus of claim 1, wherein the temperature sensors of the second temperature sensor source comprise:

a first chamber temperature sensor attached to an upper portion of the chamber and configured to measure a temperature of the upper portion of the chamber;

a second chamber temperature sensor attached to a sidewall portion of the chamber and configured to measure a temperature of the sidewall portion of the chamber; and a third chamber temperature sensor attached to a lower portion of the chamber and configured to measure a temperature of the lower portion of the chamber.

3. The apparatus of claim 2, wherein the first chamber temperature sensor, the second chamber temperature sensor, and the third chamber temperature sensor each transmit a measured temperature value to the processor.

4. The apparatus of claim 1, wherein the processor comprises a PID controller configured to calculate an error by comparing the set temperatures to the reference temperatures.

5. The apparatus of claim 4, wherein the processor further comprises a control unit configured to control the plurality of heaters to supply heat to an inside of the chamber, and the control unit is configured to receive an indication of the error from the PID controller and to control the plurality of heaters to supply heat.

6. The apparatus of claim 5, wherein the plurality of heaters comprise:

a first heater installed at an upper portion of the chamber, a second heater installed at a sidewall portion of the chamber, and a third heater installed at a lower portion of the chamber.

7. The apparatus of claim 1, wherein the fluid comprises an inert fluid.

8. The apparatus of claim 1, wherein the processor is configured to calculate a plurality of predicted temperatures of the chamber based on the data from the first temperature sensor source, and the plurality of predicted temperatures are determined as the set temperatures.

9. A chamber temperature control apparatus for controlling a temperature of a chamber that uses plasma to process a wafer mounted on a support unit, the apparatus comprising:

an RF power source positioned within the chamber and configured to supply RF power to generate the plasma;

a chiller configured to supply fluid to or retrieve fluid from the support unit;

a first temperature sensor source including temperature sensors attached to supply and retrieval lines of the chiller;

a second temperature sensor source including a plurality of chamber temperature sensors attached to the chamber and configured to each measure a temperature at a specific point in the chamber;

a processor configured to determine set temperatures to be compared with reference temperatures of the chamber by determining whether the RF power source is operating; and a plurality of heaters attached inside the chamber;

wherein the plurality of chamber temperature sensors comprise:

a first chamber temperature sensor attached to an upper portion of the chamber and configured to measure a temperature of the upper portion of the chamber;

a second chamber temperature sensor attached to a sidewall portion of the chamber and configured to measure a temperature of the sidewall portion of the chamber; and a third chamber temperature sensor attached to a lower portion of the chamber and configured to measure a temperature of the lower portion of the chamber, wherein the plurality of heaters comprise:

a first heater installed at the upper portion of the chamber, a second heater installed at the sidewall portion of the chamber, and a third heater installed at the lower portion of the chamber, wherein:

the processor is configured to:

determine the set temperatures based on data from the first temperature sensor source when the RF power source is operating;

determine the set temperatures based on data from the second temperature sensor source when the RF power source is not operating; and control the plurality of heaters based on a comparison of the set temperatures and the reference temperatures.

10. The apparatus of claim 9, wherein the processor comprises;

a PID controller configured to calculate an error by comparing the set temperatures to the reference temperatures, a control unit configured to control the plurality of heaters to supply heat to the inside of the chamber, and a reference value input unit configured to input the reference temperatures.

11. The apparatus of claim 9, wherein the first chamber temperature sensor, the second chamber temperature sensor, and the third chamber temperature sensor each transmit a measured temperature value to the processor.

12. The apparatus of claim 9, wherein the processor is configured to calculate a plurality of predicted temperatures of the chamber based on the data from the first temperature sensor source, and the plurality of predicted temperatures are determined as the set temperatures.

13. The apparatus of claim 12, wherein the plurality of predicted temperatures comprise a predicted temperature of the upper portion of the chamber, a predicted temperature of the sidewall portion of the chamber, and a predicted temperature of the lower portion of the chamber.

* * * * *